United States Patent [19]

Mijuskovic

[11] Patent Number: 4,983,974
[45] Date of Patent: Jan. 8, 1991

[54] ANALOG-TO-DIGITAL CONVERSION BY VARYING BOTH INPUTS OF A COMPARATOR UTILIZING SUCCESSIVE APPROXIMATION

[75] Inventor: Dejan Mijuskovic, Chandler, Ariz.
[73] Assignee: Motorola, Inc., Schaumburg, Ill.
[21] Appl. No.: 475,497
[22] Filed: Feb. 6, 1990
[51] Int. Cl.$^5$ .............................................. H03M 1/34
[52] U.S. Cl. ..................................... 341/156; 341/159
[58] Field of Search ............... 341/155, 139, 145, 156, 341/158, 159, 165, 172

[56] References Cited

U.S. PATENT DOCUMENTS

| | | | |
|---|---|---|---|
| 3,495,235 | 2/1970 | Ottesen ................................. | 341/165 |
| 4,385,286 | 5/1983 | Haque .................................. | 341/172 |
| 4,707,682 | 11/1987 | Brokaw et al. ................. | 341/155 X |
| 4,852,130 | 7/1989 | Draxelmayr .................... | 341/155 X |
| 4,907,002 | 3/1990 | Kawada ........................... | 341/155 X |
| 4,908,624 | 3/1990 | Goto et al. ...................... | 341/155 X |
| 4,940,981 | 7/1990 | Naylor et al. ........................ | 341/161 |

*Primary Examiner*—A. D. Pellinen
*Assistant Examiner*—Brian K. Young
*Attorney, Agent, or Firm*—Michael Bingham; Robert Atkins

[57] ABSTRACT

An analog-to-digital converter is provided wherein an analog input signal and one of a series of predetermined reference potentials are stored across first and second capacitors, respectively, to establish a balanced zero differential signal across the first and second inputs of a comparator. The output signal of the comparator drives a logic circuit for generating first and second portions of a digital control signal wherein the first portion selects between the lower resolution reference potentials searching for a first reference potential of the greatest value which when compared to voltage stored across the first capacitor provides the least magnitude differential signal across the first and second inputs of the comparator thereby resolving a major portion of the analog input signal. The second portion of the digital control signal selects between the fine resolution reference potentials searching for a second reference potential which minimizes the differential signal thereby resolving the remaining portion of the analog input signal. The first and second portions of the digital control signal provides the most significant bits and the least significant bits of the digital output signal, respectively. A parallel operation is also provided wherein the reference potentials are simultaneously compared in two steps to the voltage stored across the first and second capacitors via a number of comparators. The first step provides the MSB of the digital output signal and the second step provides the LSB of the digital output signal.

14 Claims, 4 Drawing Sheets

ANALOG-TO-DIGITAL CONVERSION BY VARYING BOTH INPUTS OF A COMPARATOR UTILIZING SUCCESSIVE APPROXIMATION

BACKGROUND OF THE INVENTION

This invention relates in general to analog-to-digital (A/D) converters, and more particularly, to an A/D converter which varies both inputs of a comparator during a search by successive approximation to resolve the analog input signal into a multi-bit digital output signal.

A/D converters are well enough known in the art and many techniques have been developed for achieving the conversion from analog to digital format. One common A/D converter utilizes a large number of serially coupled resistors, 255 or more for 8-bit resolution, to generate an equal number of reference potentials each of which is compared to the analog input signal. A digital control signal systematically selects between the 255 reference potentials until the one closest in magnitude to the analog input signal is identified. The corresponding value of the 8-bit digital control signal provides the 8-bit digital output signal of the analog-to-digital conversion. One undesirable feature of the aforedescribed A/D converter is the requirement to generate 255 reference potentials and the need for 255 plus switches to sequential select therebetween. It is desirable to reduce the complexity of the A/D converter by limiting the number of reference potentials needed for the conversion.

In another known A/D converter, a subtraction technique is used to reduce the number of reference potentials wherein for each 8-bit A/D conversion, the analog input signal is sampled and applied to a first 4-bit A/D converter. A string of sixteen resistors is serially coupled between first and second power supply conductors, the latter of which are energized to positive and negative supply potentials representing the upper and lower acceptable limits of the analog input signal. The string of sixteen resistors provides a equal number of linearly graduated reference potentials which are systematically applied to the first A/D converter through respective switches for comparison to the sampled analog input signal. The first A/D converter generates the four most significant bits (MSB) corresponding to the highest reference potential that is still lower than the sampled analog input signal. The selected reference potential is then applied to the non-inverting input terminal of a unity gain operational amplifier, while the sampled analog input signal is applied the inverting input terminal thereby providing an output signal equal to the difference of the analog input signal and the selected reference potential. A second A/D converter is coupled to the output of the operational amplifier for resolving the difference signal into the four least significant bits (LSB). The combination of the four MSB and the four LSB is the 8-bit digital output signal representative of the magnitude of the analog input signal.

The previous A/D conversion technique suffers from a speed penalty because of the settling time of the operational amplifier. In addition, the offset voltage of the operational amplifier is typically amplified by a factor of two due to the interaction of the dynamic input signals which can cause an error of one LSB or more in the digital output signal. Hence, it is desirable to eliminate the need for the intermediate operational amplifier.

Hence, what is needed is an improved A/D converter using a search by successive approximation to reduce the number of reference potentials wherein a major portion of the analog input signal is first resolved into the most significant bits leaving a smaller portion thereof to be resolved into the least significant bits of the multi-bit digital output signal.

SUMMARY OF THE INVENTION

Accordingly, it is an objective of the present invention to provide an improved analog-to-digital converter.

A further objective of the present invention is to provide an improved analog-to-digital converter requiring a number of reference potentials much less than the decimal equivalent of the binary resolution.

Another objective of the present invention is to provide an improved analog-to-digital converter including a comparator pre-balanced with the analog input signal wherein the first input of the comparator is varied to resolve a major portion of the analog input signal into the most significant bits and the second input is varied to resolve the remaining portion of the analog input signal into the least significant bits of the digital output signal.

Yet another objective of the present invention is to provide an improved analog-to-digital converter wherein the analog input signal is resolved into the digital output signal through a search by successive approximation.

Still another objective of the present invention is to provide an improved analog-to-digital converter including a parallel combination of comparators prebalanced with the analog input signal wherein a two step search is performed to form the digital output signal.

In accordance with the above and other objectives there is provided an analog-to-digital converter responsive to an analog input signal for providing a digital output signal representative of the magnitude of the analog input signal. A first circuit develops a plurality of predetermined reference potentials wherein first and second ones of the plurality of predetermined reference potentials are provided at first and second outputs respectively in response to a digital control signal. The first terminal of a first capacitor is coupled to the input and to the first output of the first circuit, and the first terminal of a second capacitor is coupled to the second output of the first circuit, while the second terminals of the first and second capacitors are coupled to the first and second inputs of a comparator, respectively, which provides an output signal in response to a differential signal developed at the first and second inputs thereof. A second circuit is responsive to the output signal of the comparator for providing a value of the digital control signal to select the first and second ones of the plurality of reference potential which yield the least magnitude of the differential signal wherein the value of the digital control signal comprises the digital output signal.

In another aspect, the present invention comprises first circuit for developing a plurality of predetermined reference potentials, and a second circuit responsive to a digital control signal for applying first ones of the plurality of predetermined reference potentials at a first node in a singular manner. The first inputs of a plurality of comparators are coupled to the first node, while the second inputs are coupled for receiving respective first ones of the plurality of predetermined reference potentials. The third inputs of the plurality of comparators are coupled for receiving a predetermined reference potential, and the fourth inputs are coupled for receiving respective second ones of the plurality of predetermined reference potentials. A third circuit is coupled to the outputs of the plurality of comparators for providing a value of the digital control signal to select one of the respective first ones of the plurality of reference potentials closest to the analog input signal wherein the value of the digital control signal comprises the digital output signal.

DETAILED DESCRIPTION OF THE PREFERRED EMBODIMENT

Figure 1:
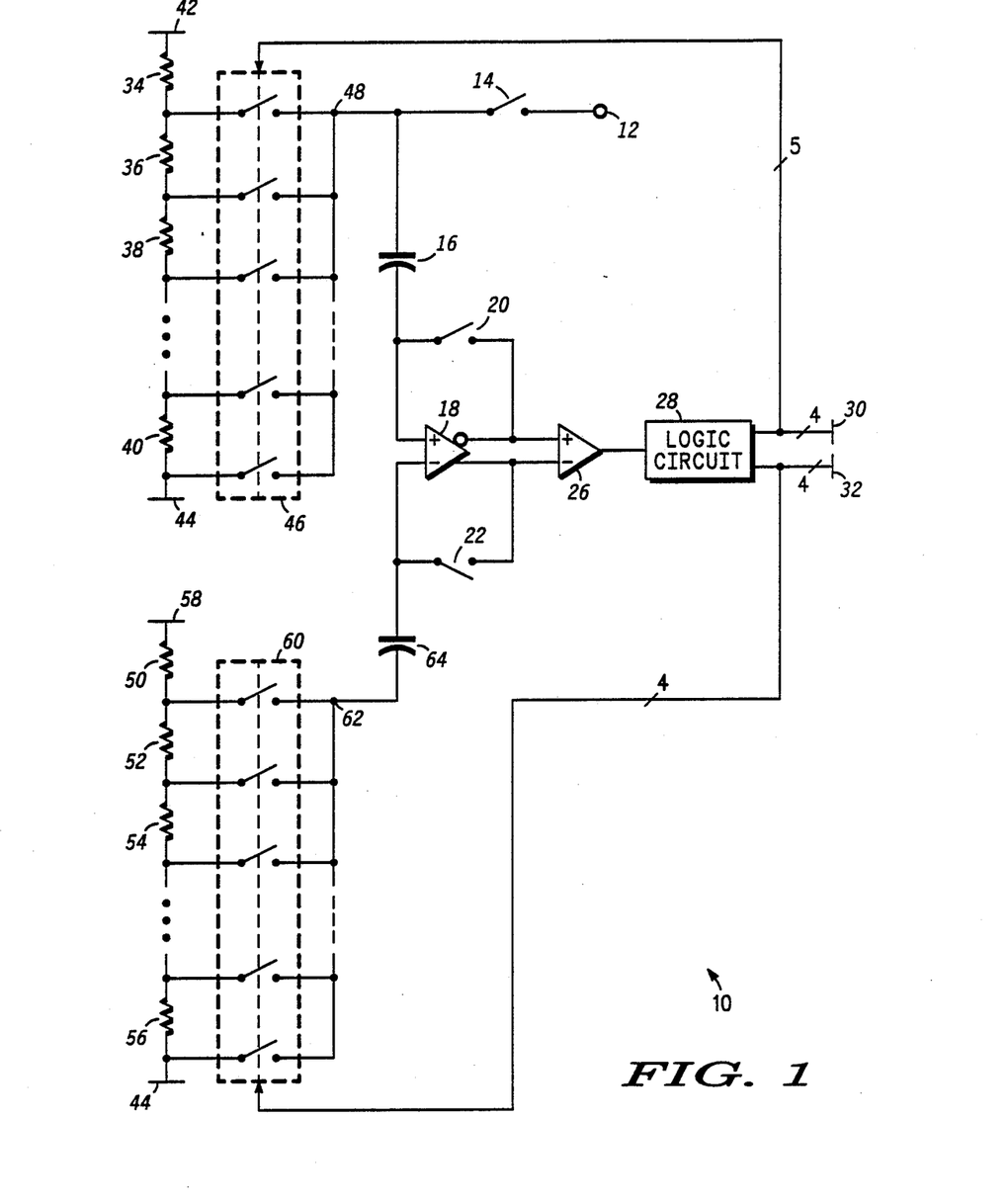
FIG. 1 is a simplified schematic and block diagram illustrating a first embodiment of the present invention.

Referring to FIG. 1, analog-to-digital converter 10 is responsive to an analog input signal applied at input 12 which is coupled through switching circuit 14 to the first terminal of capacitor 16. The second terminal of capacitor 16 is coupled to the non-inverting input terminal of comparator 18, and through switching circuit 20 to the inverting output of the same. It is understood that switching circuit 20 may comprise a transistor having its drain and source coupled in the conduction path and its gate under external control. The inverting input terminal of comparator 18 is coupled through switching circuit 22 to the non-inverting output terminal. The inverting and non-inverting output terminals of comparator 18 are coupled to the non-inverting and inverting input terminals of comparator 26, respectively, while the non-inverting output of the latter is coupled to logic circuit 28 for providing an output signal in response to the differential signal developed at the non-inverting and inverting input terminals of comparator 18. Additional comparator stages may be coupled between comparators 18 and 26 for increasing the gain therebetween. The first output of logic circuit 28 provides a first 5-bit digital control signal, while the second output of the same provides a second 4-bit digital control signal. The four LSB of the first 5-bit digital control signal are applied at output 30 for providing the four MSB of the 8-bit digital output signal, and the second 4-bit digital control signal is applied at output 32 for providing the four LSB of the 8-bit digital output signal. The combination of output 30 and output 32 forms an eight-bit digital output bus.

A first group of sixteen resistors, including resistors 34, 36, 38 and 40, are serially coupled between power supply conductors 42 and 44, the latter of which are typically energized to voltages $V_{RT}$ and $V_{RB}$, respectively, wherein voltages $V_{RT}$ and $V_{RB}$ represent the top and bottom operating limits of the analog input signal. Resistors 40, 38, 36 and 34 are identified as the first, fourteen, fifteen and sixteenth resistors of the first group, respectively. The first group of sixteen resistors are selected of equal value for providing sixteen lower resolution reference potentials linearly graduated in equal steps between $$V_{RB} + \left\{ (V_{RT} - V_{RB}) \times \left(\frac{15}{16}\right) \right\}$$

at the interconnection of resistors 34 and 36, and $V_{RB}$ at power supply conductor 44. The first 5-bit digital control signal is applied to the control input of switching circuit 46 for selecting one of the sixteen switches thereof via the sixteen unique patterns provided by the four LSB whereby the sixteen reference potentials are singularly applied at node 48 that is the first terminal of capacitor 16. For example, the first digital control signal value of "01111" may close the sixteenth switch and apply the reference potential developed at the interconnection of resistors 34 and 36 to node 48. Alternately, the first digital control signal value of "01110" may close the fifteenth switch and apply the reference potential developed at the interconnection of resistors 36 and 38 to node 48, and so on. Typically, the MSB of the first digital control signal is used to open all switches of switching circuit 46 during the times that switch 14 is closed thereby isolating the reference potentials during the sampling of the analog input signal.

Likewise, a second group of sixteen resistors, including resistors 50, 52, 54 and 56, are serially coupled between power supply conductors 58 and 44 operating at $$V_{RB} + \left\{ (V_{RT} - V_{RB}) \times \left(\frac{1}{16}\right) \right\}$$

and $V_{RB}$, respectively, whereby one-sixteenth of the full range $(V_{RT}-V_{RB})$ is developed across resistors 50–56. Resistors 56, 54, 52 and 50 are identified as the first, fourteen, fifteen and sixteenth resistors of the second group, respectively. The second group of sixteen resistors are typically selected equal to resistors 34–40 for providing sixteen higher resolution reference potentials linearly graduated in equal steps between $$V_{RB} + \left\{ (V_{RT} - V_{RB}) \times \left(\frac{1}{16}\right) \times \left(\frac{15}{16}\right) \right\}$$

at the interconnection of resistors 50 and 52, and $V_{RB}$ at power supply conductor 44.

The second 4-bit digital control signal is applied to the control input of switching circuit 60 for selecting one of the sixteen switches thereof via the sixteen unique patterns provided by four bits whereby the sixteen reference potentials are singularly applied at node 62 that is the first terminal of capacitor 64. The second terminal of capacitor 64 is coupled to the inverting input terminal of comparator 18. If the second 4-bit digital control signal is a value of "1111", for example, the sixteenth switch of switching circuit 60 is closed applying the reference potential developed at the interconnection of resistors 50 and 52 to node 62. Alternately, if the second digital control signal is a value of "1110", the fifteenth switch closes and the reference potential developed at the interconnection of resistors 52 and 54 is routed through to node 62. Hence, switching circuits 46 and 60 each operate as digital-to-analog converters (DAC) for transforming the digital control signal into one of sixteen discrete reference potentials. In all, thirty-two reference potentials are developed by the first and second groups of resistors, wherein one from each group may be applied to nodes 48 and 60, respectively, through switching circuits 46 and 60.

For the discussion of the operation of analog-to-digital converter 10, an analog input signal, voltage $V_{12}$, having a magnitude somewhere between $V_{RT}$ and $V_{RB}$ is applied at input 12. Assume that the magnitude of voltage $V_{12}$ is between the tenth and eleventh reference potentials of the first group of resistors. At the beginning of the conversion process, the first 5-bit digital control signal is initialized to value "10000" opening switching circuit 46 to isolate the analog input signal from the reference potentials developed across the first group of resistors, and the second digital control signal is initialized to "0000" closing the first switch of switching circuit 60 to apply voltage $V_{RB}$ to the first terminal of capacitor 64. Switching circuit 14 is closed to apply voltage $V_{12}$ to the first terminal of capacitor 16. In addition, switching circuits 20 and 22 are closed for creating a low impedance path to ground for the second terminals of capacitors 16 and 64 through the inverting and non-inverting outputs of comparator 18, respectively, thereby allowing capacitors 16 and 64 to charge to voltages $V_{12}$ and $V_{RB}$. It is understood that appropriate control signals are applied to open and close switching circuits 14, 20 and 22 as required and such control signals may be provided by logic circuit 28. Hence, an equilibrium is established at the non-inverting and inverting inputs terminals of comparator 18 which zeroes the differential input signal thereof and increases its sensitive to slight movements of the voltages across capacitors 16 and 64. This develops a virtual ground at the non-inverting and inverting input terminals of comparator 18.

To avoid disturbing the balance of the differential input signal of comparator 18, switching circuits 20 and 22 are simultaneously opened to remove the low impedance conduction path at the second terminals of capacitors 16 and 64, respectively, thereby locking the analog input signal with respect to voltage $V_{RB}$ across capacitors 16 and 64. Switching circuit 14 is opened to disable the analog input signal, while logic circuit 28 initiates the first value of the first digital control signal, say "01000", closing the ninth switch of switching circuit 46 and applying a mid-range reference potential such as that developed at the interconnection of the eighth and ninth resistors of the first group of sixteen resistors to node 48. The ninth reference potential is transferred through capacitor 16 due to the high impedance at the second terminal thereof and appears at the non-inverting input terminal of comparator 18. Since the mid-range reference potential is less than the voltage used to zeroize the differential signal for the present example, comparator 18 trips in the negative sense causing its inverting output signal to go high and the non-inverting output signal to go low thereby tripping comparator 26 forcing its output signal high and informing logic circuit 28 that the first evaluation of the analog input signal is too low.

Accordingly, logic circuit 28 provides the second value of the first digital control signal to close another switch of switching circuit 46 so as to develop a higher potential at node 48. For rapid convergence, each subsequent range is one-half of the preceding range, for example, since the mid-range estimate is too low, the second value of the first digital control signal may be "01100" which closes the thirteenth switch of switching circuit 46 and applies the reference potential developed at the interconnection of the twelfth and thirteenth resistors that is approximately halfway between the first estimated reference potential and the maximum reference potential. Since this second estimate is again greater than the voltage used to zeroize the differential signal, comparator 18 now trips in the positive sense causing its inverting output signal to go low and the non-inverting output signal to go high. The output signal of comparator 26 changes to a low signal indicating that the analog input signal is somewhere between the first and second estimated reference potentials corresponding to the first digital control signal values of "01000" and "01100", respectively. Consequently, the third evaluation of the first digital control signal "01010" selects the reference potential at the interconnection of tenth and eleventh resistors again tripping comparator 18 in the positive sense (reference potential too high). Logic circuit 28 then provides the fourth and last evaluation of the first digital control signal of value "01001" selecting the tenth reference potential developed between the ninth and tenth resistors of the first group of resistors causing comparator 26 to trip in the positive sense thereby resolving voltage $V_{12}$ to a value between the tenth and eleventh reference potentials. The last output state of logic circuit 28 is set to the value of the first digital control signal corresponding to the greater of the two reference potentials which is the eleventh reference potential, i.e., "01010" in the present example. This way the higher resolution reference potentials of the second group of resistors may be subtracted from the final value of the lower resolution reference potentials of the first group of resistors in order to resolve the LSB of the digital output signal.

The forgoing result matches the initial assumption of the analog input signal being between the tenth and eleventh reference potentials and demonstrates the resolution of the four MSB of the 8-bit digital output signal. The successive approximations have resolved the first 5-bit digital control signal bit-by-bit until a reference potential is located that is closest to and greater than voltage $V_{12}$. The differential signal developed at the inputs of comparator 18 is thereby reduced to the minimum value obtainable with the sixteen reference potentials of the first group of resistors. Typically, four iterations are required to resolve to the four LSB of the first digital control signal for providing the four MSB of the 8-bit digital output signal, "1010" in the present example. The last reference potential applied at node 48 effectively subtracts that major portion of the sampled analog input signal leaving a smaller portion to be resolved into the four LSB of the 8-bit digital output signal through the higher resolution reference potentials developed among the second group of resistors.

Maintaining the last state of the first digital control signal ("01010") when the four MSB were resolved, the remaining steps of the conversion involve continuing the search by successive approximation follows a similar scenario as described for the first digital control signal to identify one of the higher resolution reference potentials of the second group of resistors through switching circuit 60 which when combined with the eleventh reference potential at node 48 provides the least magnitude differential signal at the inputs of comparator 18. Logic circuit 28 generates the second digital control signal, say "1000", which is applied to the control input of switching circuit 60 thereby closing the ninth switch and applying a mid-range reference potential such as that developed at the interconnection of the eighth and ninth resistors of the second group of sixteen resistors to node 62. Since the ninth reference potential is more positive than voltage $V_{RB}$, the difference between voltage $V_{RB}$ and the ninth reference potential is transferred through capacitor 64 due to the high impedance at the inverting input terminal of comparator 18 and causes an equal shift in the differential input signal thereof. If the differential input signal is still positive after the shift, comparator 18 trips in the positive sense indicating that the selected reference potential is too low. Accordingly, logic circuit 28 provides the second value of the second digital control signal "1100" to close the thirteenth switch of switching circuit 60 and provide the more positive reference potential developed at the interconnection of resistors twelfth and thirteenth resistors of the second group of resistors. This process continues until logic circuit 28 has identified four bits of the second digital control signal which result in the minimum differential input signal for comparator 18 given the resolution of the reference potentials. Again, the search by successive approximation splits the preceding range in half for each evaluation. Hence, the resulting second digital control signal provided at output 32 is the four LSB of the 8-bit digital output signal thereby completing the A/D conversion with an 8-bit output resolution.

The construction of logic circuit 28 is believed to be well known and understood from the aforedescribed operation. For example, logic circuit 28 may comprise an 8-bit register, commonly referred to as a successive approximation register, wherein the output signal of comparator 26 is written to successively lower order bits starting from the MSB.

Figure 2:
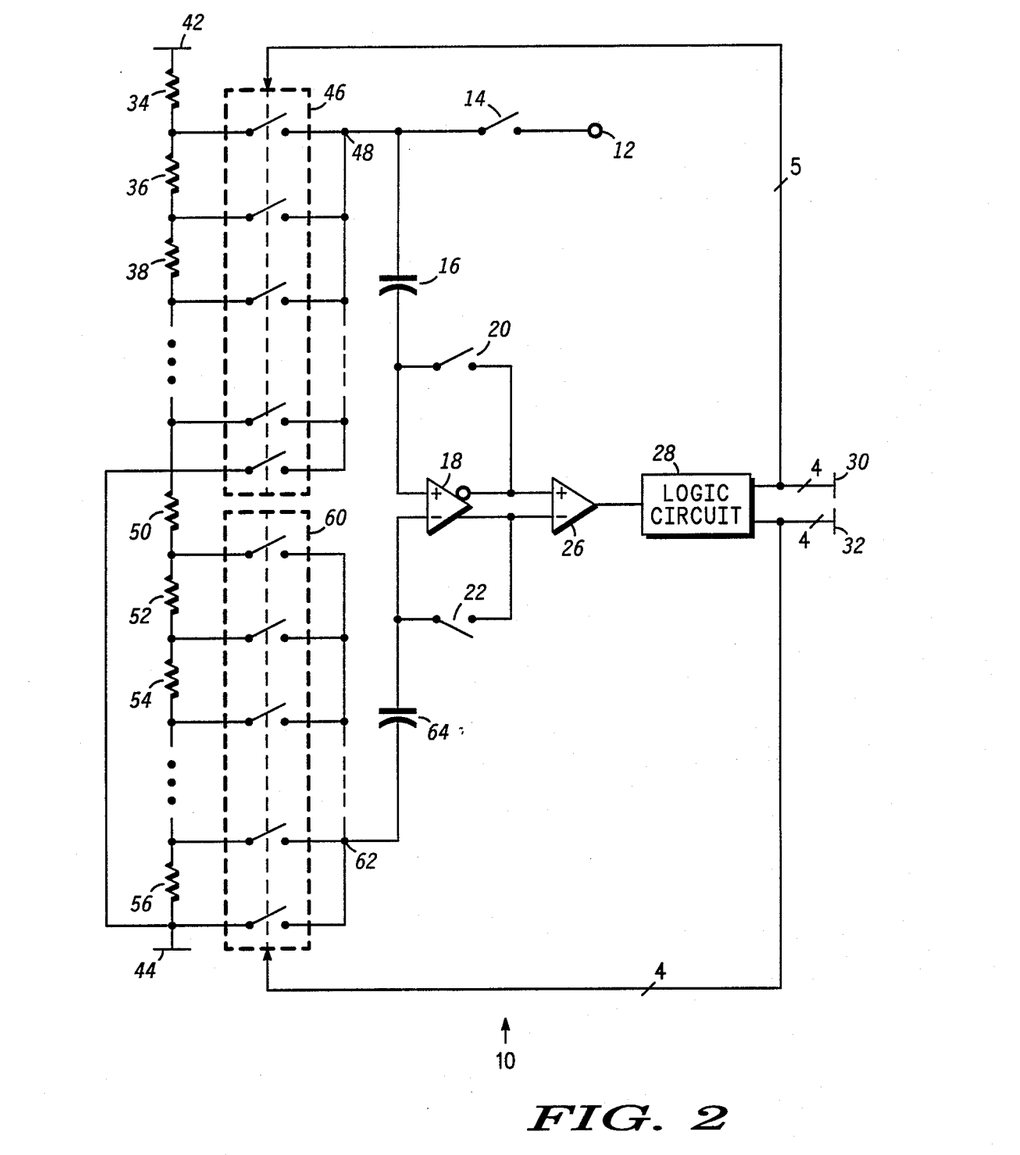
FIG. 2 is a simplified schematic and block diagram illustrating an alternate embodiment of the present invention.

Turning to FIG. 2, analog-to-digital converter 10 is shown as an alternate embodiment wherein resistor 40 is replaced with a second group of sixteen resistors (including resistors 50–56). The first terminal of resistor 50 is connected to the node previously occupied by the first terminal of resistor 40, and the second terminal of resistor 56 remains coupled to power supply conductor 44. Notably, the reference potential $V_{RB}$ is still applied to the first switch of switching circuit 46, and the second group of sixteen resistors are typically selected equal in value each one-sixteenth the value of resistors 34–40.

The operation of analog-to-digital converter 10 of FIG. 2 follows that of FIG. 1 wherein the analog input signal is applied at input 12, and switching circuits 14, 20 and 22 are closed to store voltages $V_{12}$ and $V_{RB}$ across capacitors 16 and 64. Switching circuits 20, 22 and 14 are opened after which logic circuit 28 provides the first value of the first digital control signal to supply the mid-range reference potential to node 48. Through the successive approximations, the first digital control signal is resolved bit-by-bit until a reference potential is located that is closest to and greater than voltage $V_{12}$. Again, maintaining the last state of the first digital control signal, logic circuit 28 continues providing successive trials of the second digital control signal until four bits of the second digital control signal are identified which result in the minimum differential input signal for comparator 18 given the resolution of the reference potentials.

Figure 3:
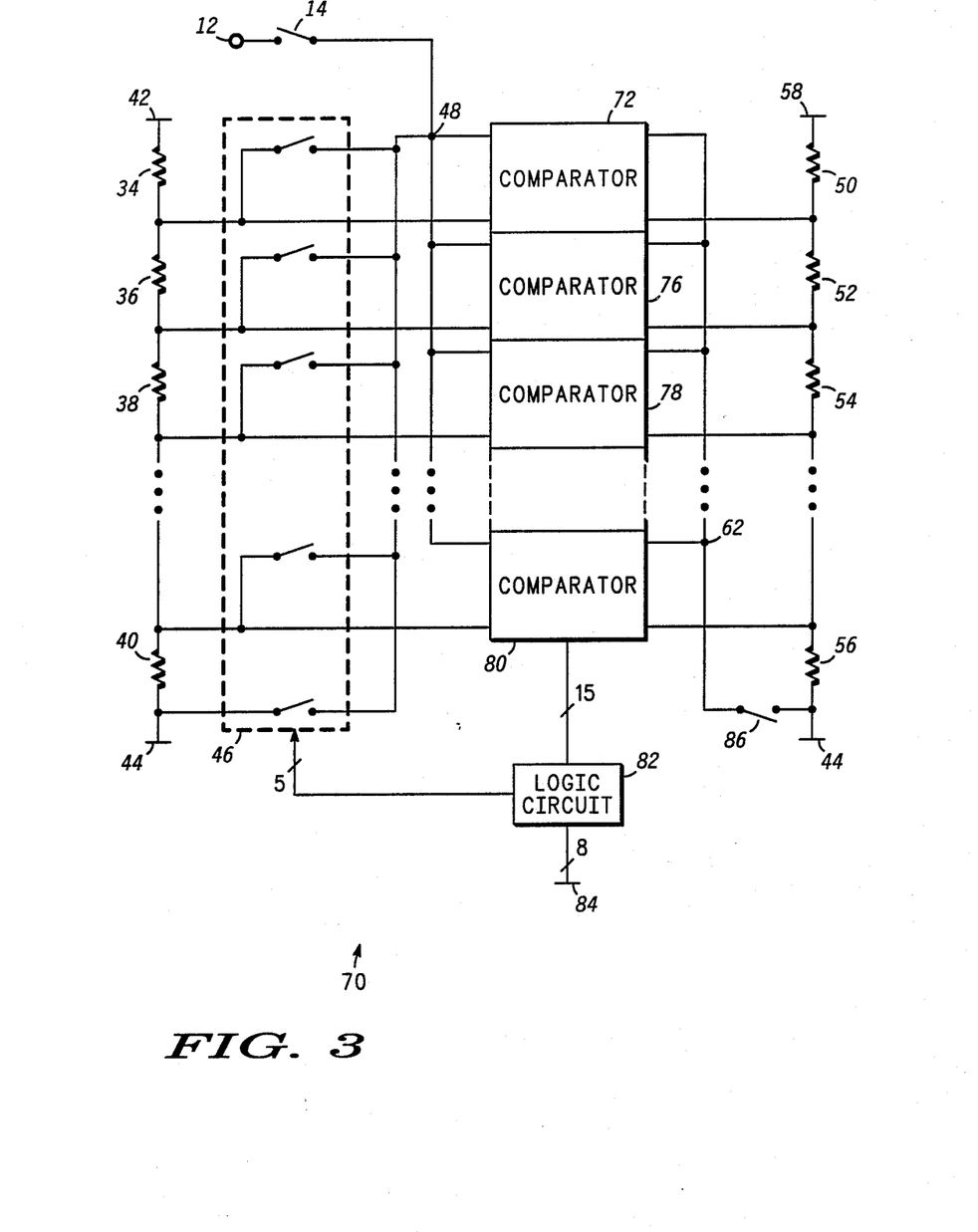
FIG. 3 is a simplified block diagram illustrating an embodiment of the present invention for parallel operation.

Referring to FIG. 3, A/D converter 70 is illustrated connected for parallel operation comprising fifteen comparators, four of which are shown as comparators 72, 76, 78 and 80. Circuit components having a similar function as previously described are assigned the same reference number as FIG. 1. The first group of resistors comprising resistors 34, 36, 38 and 40 provide sixteen reference potentials which are singularly applied through switching circuit 46 to node 48. The potential at node 48 is simultaneously applied to the first inputs of comparators 72, 74, 76 and 80. The outputs of the fifteen comparators (72–80) are coupled to the input of logic circuit 82 for providing the 8-bit digital output signal at output bus 84 and a 5-bit digital control signal at the control input of switching circuit 46. The second inputs of comparators 72–80 are coupled directly to the interconnections of the first group of resistors, for example, the second input of comparator 72 is coupled to the interconnection of resistors 34 and 36. The third inputs of comparators 72–80 are coupled to node 62 and through switching circuit 86 to power supply conductor 44. The fifteen reference potentials developed among the second group of resistors (50–56) are applied to the fourth inputs of comparators 72–80, respectively.

Figure 4:
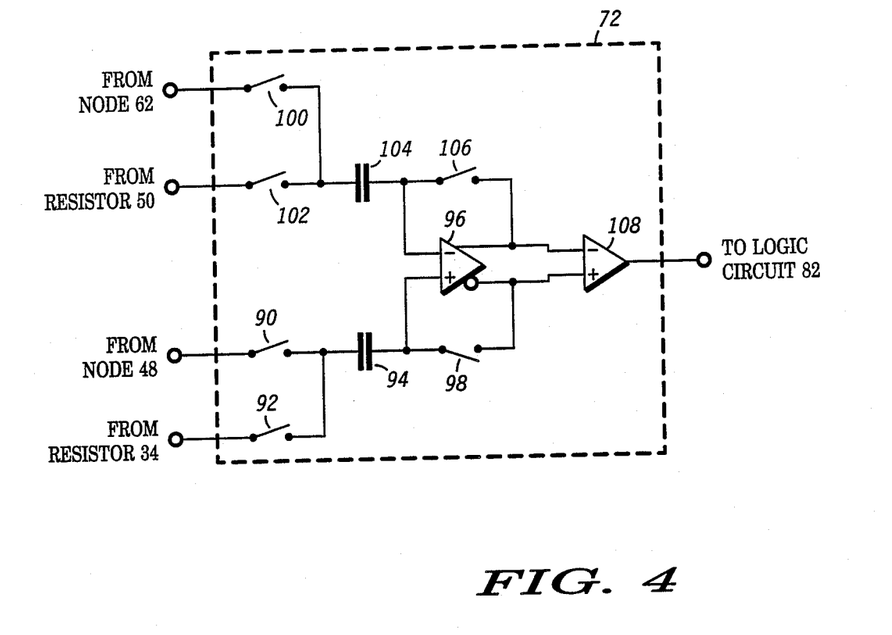
FIG. 4 is a simplified schematic and block diagram showing additional detail of one comparator operating in parallel.

Turning to FIG. 4, comparator 72 is presented in greater detail including switching circuits 90 and 92 coupled between the first and second inputs thereof, respectively, and the first terminal of capacitor 94. The second terminal of capacitor 94 is coupled to the non-inverting input of comparator 96 and through switching circuit 98 to the inverting output of comparator 96. In addition, switching circuits 100 and 102 coupled between the third and fourth inputs of comparator 72, respectively, and the first terminal of capacitor 104. The second terminal of capacitor 104 is coupled to the inverting input of comparator 96 and through switching circuit 106 to the inverting output of the same. The inverting and non-inverting outputs of comparator 96 are coupled to the inverting and non-inverting inputs of comparator 108, the output of which provides a logic one or logic zero at the MSB input of logic circuit 82. Comparators 74–80 have a similar construction as described for comparator 72.

The operation of A/D converter 70 begins with the application of voltage $V_{12}$ at input 12. Switching circuits 46, 92 and 102 are opened and switching circuits 14, 86, 90, 98, 100 and 106 are closed thereby developing a balanced differential signal at the inverting and non-inverting inputs of comparator 96. Next, switching circuits 14, 90, 98 and 106 are opened and switching circuit 92 is closed causing an upper group of comparators 72–80 to trip in the negative sense while the remainder of comparators 72–80 trip in the positive sense depending upon the voltage stored across capacitors 94 and 104 as compared to the reference potentials of the first group of resistors. For example, if comparator 72 trips in the negative sense and comparators 74–80 (remaining fourteen) trip in the positive sense, voltage $V_{12}$ is somewhere between the fifteenth and sixteenth reference potentials developed at the interconnection of resistors 36 and 38 and the interconnection of resistors 34 and 36, respectively. The fifteen 1-bit digital output signals of comparators 72–80 ("011111111111111") are applied to logic circuit 82 which generates the digital control signal "01111" to close the sixteenth switch of switching circuit 46 that is the closest to and greater than voltage $V_{12}$. The four MSB of the 8-bit digital output signal is thus "1111" from the digital control signal. Switching circuits 92 and 100 are then opened and switching circuits 90 and 102 are closed thereby applying the sixteenth reference potential at node 48 to the first inputs of comparators 72–80 for comparison against the fifteen reference potentials developed among the second group of resistors. The parallel comparison is again performed and the fifteen 1-bit digital output signals of comparators 72–80 are applied to logic circuit 82 for identification of the four LSB of the 8-bit digital output signal in a like manner.

The construction of logic circuit 82 is believed to be well known and understood from the aforedescribed operation. For example, logic circuit 82 may comprise decode logic to identify the bit location of the change over from logic ones to logic zeroes in the 15-bit output signal of comparators 72–80. The output of the decode logic provides a binary-coded signal which is stored internally and sequentially provides the MSB and the LSB of the 8-bit digital output signal at output bus 84 as well as a portion of the 5-bit digital control signal applied at the control input of switching circuit 46.

Hence, what has been described is a novel analog-to-digital converter including a comparator pre-balanced with the analog input signal and using a search of predetermined reference potentials by successive approximation wherein the first input of the comparator is varied according to the available reference potentials to resolve a major portion of the analog input signal into the most significant bits leaving a much smaller portion to be resolved into the least significant bits of the 8-bit digital output signal by varying the second input thereof with the fine resolution reference potentials. In addition, the A/D conversion may also be performed in a parallel manner using a two step approach wherein the first step provides the MSB of the digital output signal and the second step provides the LSB of the digital output signal.

I claim:

1. A method of converting an analog input signal into a digital output signal representative of the magnitude of the analog input signal, comprising the steps of:
    developing first and second pluralities of reference potentials and providing a selected one of said first plurality of reference potentials according to a first portion of a digital control signal and a selected one of said second plurality of reference potentials according to a second portion of said digital control signal;
    storing a first signal representative of the magnitude of the analog input signal;
    balancing said first signal and the least of said second plurality of reference potentials to establish a substantially zero differential input signal;
    disabling the analog input signal;
    comparing said first signal with ones of said first plurality of reference potentials as determined by said first portion of said digital control signal;
    adjusting said first portion of said digital control signal until one of said first plurality of reference potentials reduces said differential input signal to a first minimum level;
    comparing the difference between said first signal and said one of said first plurality of reference potentials with ones of said second plurality of reference potentials as determined by said second portion of said digital control signal; and
    adjusting said second portion of said digital control signal until one of said second plurality of reference potentials reduces said differential input signal to a second minimum level wherein the final value of said first portion of said digital control signal represents the most significant bits of the digital output signal and the final value of said second portion of said digital control signal represents the least significant bits of the digital output signal.

2. An analog-to-digital converter having an input coupled for receiving an analog input signal and having an output bus for providing a digital output signal representative of the magnitude of the analog input signal, comprising:
    first means for developing first and second pluralities of reference potentials such that a selected one of said first plurality of reference potentials is provided at a first output and a selected one of said second plurality of reference potentials is provided at a second output according to a digital control signal;
    first switching means coupled between said first output of said first means and the input of the analog-to-digital converter for enabling and disabling the analog input signal;
    first capacitive means having first and second terminals, said first terminal being coupled to said first output of said first means for storing a sample of the analog input signal;
    second capacitive means having first and second terminals, said first terminal being coupled to said second output of said first means for storing a sample of one of said second plurality of reference potentials;
    comparing means having a first input coupled to said second terminal of said first capacitive means and a second input coupled to said second terminal of said second capacitive means for providing an output signal in response to a differential signal developed at said first and second inputs thereof; and
    second means responsive to said output signal of said comparing means for providing a value of said digital control signal to select ones of said first and second pluralities of reference potentials which yield the least magnitude of said differential signal, said value of said digital control signal providing the digital output signal of the analog-to-digital converter.

3. The analog-to-digital converter of claim 2 wherein said comparing means comprises:
    a first comparator having first and second inputs and first and second outputs, said first input being coupled to said second terminal of said first capacitive means, said second input being coupled to said second terminal of said second capacitive means; and
    a second comparator having first and second inputs and an output, said first input being coupled to said first output of said first comparator, said second input being coupled to said second output of said first comparator, said output being coupled to said second means for providing said output signal of said comparing means.

4. The analog-to-digital converter of claim 2 further comprising:
    second switching means coupled between said first input of said first comparator and said first output of said first comparator for enabling and disabling the conduction path therebetween; and
    third switching means coupled between said second input of said first comparator and said second output of said first comparator for enabling and disabling the conduction path therebetween.

5. The analog-to-digital converter of claim 4 wherein said digital control signal includes first and second portions, said first portion of said digital control signal representing the most significant bits of the digital output signal and said second portion of said digital control signal representing the least significant bits of the digital output signal.

6. The analog-to-digital converter of claim 5 wherein said second means comprises a logic circuit responsive to said output signal of said comparing means for providing said first and second portions of said digital control signal at first and second outputs.

7. The analog-to-digital converter of claim 6 wherein said first means comprises:
   a first plurality of resistors serially coupled between first and second sources of operating potential for developing said first plurality of reference potentials;
   fourth switching means having a plurality of inputs respectively coupled to the interconnection of ones of said first plurality of resistors for providing one of said first plurality of reference potentials to said first terminal of said first capacitive means in response to said first portion of said digital control signal;
   a second plurality of resistors serially coupled between third and fourth sources of operating potential for developing said second plurality of reference potentials; and
   fifth switching means having a plurality of inputs respectively coupled to the interconnection of ones of said second plurality of resistors for providing one of said second plurality of reference potentials to said first terminal of said second capacitive means in response to said second portion of said digital control signal.

8. The analog-to-digital converter of claim 6 wherein said first means further comprises:
   a plurality of resistors serially coupled between first and second sources of operating potential for developing said first and second pluralities of reference potentials;
   fourth switching means having a plurality of inputs respectively coupled to the interconnection of first ones of said plurality of resistors for providing a first one of said plurality of reference potentials to said first terminal of said first capacitive means in response to said first portion of said digital control signal; and
   fifth switching means having a plurality of inputs respectively coupled to the interconncetion of second ones of said plurality of resistors for providing a second one of said plurality of reference potentials to said first terminal of said second capacitive means in response to said second portion of said digital control signal.

9. A circuit for converting an analog input signal applied at an input to a digital output signal, comprising:
   first and second pluralities of resistors each serially coupled between first and second sources of operating potential for developing first and second pluralities of reference potentials;
   a first switching circuit having a plurality of inputs respectively coupled to the interconnections of said first plurality of resistors for providing one of said first plurality of reference potentials at a first node in response to a first portion of a digital control signal;
   a second switching circuit having a plurality of inputs respectively coupled to the interconnections of said second plurality of resistors for providing one of said second plurality of reference potentials at a second node in response to a second portion of said digital control signal;
   a third switching circuit coupled between said first node and the input of the circuit for enabling and disabling the analog input signal;
   a first capacitor having first and second terminals, said first terminal being coupled to said first node for storing a sample of the analog input signal;
   a second capacitor having first and second terminals, said first terminal being coupled to said second node for storing a sample of one of said second plurality of reference potentials;
   a first comparator having a first input coupled to said second terminal of said first capacitor and a second input coupled to said second terminal of said second capacitor for providing an output signal at first and second outputs in response to a differential signal developed at said first and second inputs thereof; and
   a logic circuit coupled to said output of said first comparator for providing a value of said digital control signal to select ones of said first and second pluralities of reference potentials which yield the least magnitude of said differential signal, said value of said digital control signal providing the digital output signal of the circuit.

10. The circuit of claim 9 further comprises a second comparator having first and second inputs and an output, said first input being coupled to said first output of said first comparator, said second input being coupled to said second output of said first comparator, said output being coupled to said logic circuit.

11. The circuit of claim 10 further comprising:
   a fourth switching circuit coupled between said first input of said first comparator and said first output of said first comparator for enabling and disabling the conduction path therebetween; and
   a fifth switching circuit coupled between said second input of said first comparator and said second output of said first comparator for enabling and disabling the conduction path therebetween.

12. The circuit of claim 11 wherein said first portion of said digital control signal represents the most significant bits of the digital output signal and said second portion of said digital control signal represents the least significant bits of the digital output signal.

13. An analog-to-digital converter having an input coupled for receiving an analog input signal and having an output bus for providing a digital output signal representative of the magnitude of the analog input signal, comprising:
   first means for developing first and second pluralities of reference potentials at first and second pluralities of outputs respectively;
   second means coupled for receiving said first plurality of reference potentials and providing one of said first plurality of reference potentials at a first node in response to a digital control signal;
   a first switching circuit coupled between said first node and the input of the analog-to-digital converter for enabling and disabling the analog input signal;

a plurality of comparators each including,
   first capacitive means having first and second terminals,
   a second switching circuit coupled between said first node and said first terminal of said first capacitive means,
   a third switching circuit coupled between one of said first plurality of outputs of said first means and said first terminal of said first capacitive means,
   second capacitive means having first and second terminals;
   a fourth switching circuit coupled between a source of reference potential and said first terminal of said second capacitive means,
   a fifth switching circuit coupled between one of said second plurality of outputs of said first means and said first terminal of said second capacitive means, and
   comparing means having first and second inputs coupled to said second terminals of said first and second capacitive means respectively for providing an output signal in response to a differential signal developed at said first and second inputs thereof; and
third means coupled for receiving said output signals of said plurality of comparators for providing a value of said digital control signal to select one of said first plurality of reference potentials closest to the analog input said value of said digital control signal providing the digital output signal of the analog-to-digital converter.

14. The analog-to-digital converter of claim 13 wherein said comparing means comprises:
   a first comparator having first and second inputs and first and second outputs, said first input being coupled to said second terminal of said first capacitive means, said second input being coupled to said second terminal of said second capacitive means; and
   a second comparator having first and second inputs and an output, said first input being coupled to said first output of said first comparator, said second input being coupled to said second output of said first comparator, said output being coupled to said third means for providing said output signal of said comparing means.

* * * * *